US010873309B2

(12) United States Patent
Mori

(10) Patent No.: US 10,873,309 B2
(45) Date of Patent: Dec. 22, 2020

(54) LC FILTER, RADIO-FREQUENCY FRONT-END CIRCUIT, AND COMMUNICATION DEVICE

(71) Applicant: Murata Manufacturing Co., Ltd., Kyoto (JP)

(72) Inventor: Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/282,532

(22) Filed: Feb. 22, 2019

(65) Prior Publication Data

US 2019/0190481 A1     Jun. 20, 2019

Related U.S. Application Data

(63) Continuation of application No. PCT/JP2017/029927, filed on Aug. 22, 2017.

(30) Foreign Application Priority Data

Sep. 5, 2016   (JP) .................................. 2016-173042

(51) Int. Cl.
    *H03H 7/01*   (2006.01)
    *H03H 7/12*   (2006.01)
    *H04B 1/52*   (2015.01)
    *H03H 7/075*  (2006.01)
    (Continued)

(52) U.S. Cl.
    CPC .......... *H03H 7/0115* (2013.01); *H03H 7/075* (2013.01); *H03H 7/12* (2013.01);
    (Continued)

(58) Field of Classification Search
    CPC ........ H03H 2001/0085; H03H 7/0115; H03H 7/175; H03H 7/1758; H03H 7/12
    (Continued)

(56) References Cited

U.S. PATENT DOCUMENTS

2007/0120627 A1   5/2007  Kundu
2009/0033439 A1*  2/2009  Igarashi .............. H01P 1/20345
                                                              333/185

(Continued)

FOREIGN PATENT DOCUMENTS

JP       2005-136888 A      5/2005
JP       2008-271421 A      11/2008
                 (Continued)

OTHER PUBLICATIONS

International Search Report for International Application No. PCT/JP2017/029927, dated Nov. 7, 2017.

(Continued)

*Primary Examiner* — Rakesh B Patel
(74) *Attorney, Agent, or Firm* — Pearne & Gordon LLP

(57) ABSTRACT

A variable-frequency LC filter (1A) includes a multilayer circuit board, a series arm capacitor (11) formed in the multilayer circuit board and disposed in a series arm path that connects an input electrode to an output electrode, and a parallel arm inductor (21) formed in the multilayer circuit board and disposed in a parallel arm path that connects a ground electrode to a node (N1) in the series arm path. When the multilayer circuit board is viewed in plan, of the series arm capacitor (11) and the parallel arm inductor (21), only the parallel arm inductor (21) overlaps with the ground electrode.

12 Claims, 8 Drawing Sheets

(51) Int. Cl.
*H05K 1/02* (2006.01)
*H03H 1/00* (2006.01)

(52) U.S. Cl.
CPC .......... *H03H 7/175* (2013.01); *H03H 7/1708* (2013.01); *H03H 7/1758* (2013.01); *H03H 7/1766* (2013.01); *H03H 7/1775* (2013.01); *H04B 1/52* (2013.01); *H05K 1/0298* (2013.01); *H03H 2001/0085* (2013.01); *H03H 2210/012* (2013.01); *H03H 2210/015* (2013.01); *H03H 2210/025* (2013.01)

(58) Field of Classification Search
USPC .................................................. 333/175, 185
See application file for complete search history.

(56) References Cited

U.S. PATENT DOCUMENTS

| | | |
|---|---|---|
| 2013/0187712 A1 | 7/2013 | Cabanillas et al. |
| 2014/0106698 A1 | 4/2014 | Mi et al. |
| 2015/0271916 A1 | 9/2015 | Harada |
| 2017/0063413 A1* | 3/2017 | Ripley ................. H04B 1/1036 |
| 2017/0244442 A1 | 8/2017 | Mizokami et al. |
| 2017/0331444 A1 | 11/2017 | Mori |

FOREIGN PATENT DOCUMENTS

| | | |
|---|---|---|
| JP | 2009-517920 A | 4/2009 |
| JP | 2015-508621 A | 3/2015 |
| JP | 5773096 B1 | 9/2015 |
| WO | 2013/005264 A1 | 1/2013 |
| WO | 2016/030942 A1 | 3/2016 |
| WO | 2016/125515 A1 | 8/2016 |

OTHER PUBLICATIONS

Written Opinion for International Application No. PCT/JP2017/029927, dated Nov. 7, 2017.

* cited by examiner

Prior Art

LC FILTER, RADIO-FREQUENCY FRONT-END CIRCUIT, AND COMMUNICATION DEVICE

This is a continuation of International Application No. PCT/JP2017/029927 filed on Aug. 22, 2017 which claims priority from Japanese Patent Application No. 2016-173042 filed on Sep. 5, 2016. The contents of these applications are incorporated herein by reference in their entireties.

BACKGROUND OF THE DISCLOSURE

Field of the Disclosure

The present disclosure relates to an LC filter, a radio-frequency front-end circuit, and a communication device.

Description of the Related Art

In recent years, to support multiple bands, mobile communication terminals need small front-end circuits that allow transmission and reception signals to propagate with low loss and low noise. For this reason, filters that make up the front-end circuits are desired to be small with low loss.

Patent Document 1 describes a band pass filter made up of inductors and capacitors.

FIG. 7A is a circuit configuration diagram of the band pass filter described in Patent Document 1. In addition, FIG. 7B is a packaging diagram of the band pass filter described in Patent Document 1. The band pass filter 500 described in FIG. 7A includes three LC pairs 520, 530, 540, a direct coupling capacitor 550, internal coupling capacitors 517, 518, and resonators 510, 511, 512. The LC pair 520 is made up of a load capacitor 521 and a load inductor 522. The LC pair 530 is made up of a load capacitor 531 and a load inductor 532. The LC pair 540 is made up of a load capacitor 541 and a load inductor 542.

In addition, as shown in FIG. 7B, the band pass filter 500 is formed in a multilayer structure of low-temperature co-fired ceramic (LTCC) process. Floating grounds 601, 602, 603 are formed in the multiplayer structure. In addition, metal regions 610, 611, 612 make up the load inductors 522, 532, 542, respectively. A metal region 613 together with the floating grounds 603, 601 makes up the load capacitor 521. A metal region 614 together with the floating grounds 603, 601 makes up the load capacitor 531. A metal region 615 together with the floating grounds 603, 601 makes up the load capacitor 541. A metal region 617 together with a metal region 616 makes up the parallel-plate internal coupling capacitor 517. A metal region 618 together with the metal region 616 makes up the parallel-plate internal coupling capacitor 518. Metal regions 619, 620 make up the parallel-plate direct coupling capacitor 550. With the above configuration, it is possible to provide a small LC filter with good attenuation characteristics.

Patent Document 1: Japanese Unexamined Patent Application Publication (Translation of PCT Application) No. 2009-517920

BRIEF SUMMARY OF THE DISCLOSURE

In the band pass filter 500 described in Patent Document 1, when the multilayer circuit board is viewed in plan, the floating grounds 601, 602, 603 that are ground electrodes are provided at locations that overlap with the so-called series arm circuits and parallel arm circuits. More specifically, the metal regions 613, 614, 615 that make up the load capacitors 521, 531, 541 of the parallel arm circuits each overlap with the floating grounds 601, 603. In addition, the metal regions 616, 617, 618 that make up the internal coupling capacitors 517, 518 of the series arm circuit each overlap with the floating ground 603. In addition, the metal regions 619 and 620 that make up the direct coupling capacitor 550 of the series arm circuit each overlap with the floating ground 602.

However, in the plan view, since the floating ground 603 is disposed at the location that overlaps with the internal coupling capacitors 517, 518 of the series arm circuit and the floating ground 602 is disposed at the location that overlaps with the direct coupling capacitor 550, a stray capacitance of a large capacitance value is generated in each of the series arm circuits. If a stray capacitance is generated in each of the series arm circuits of the LC filter, the insertion loss and attenuation characteristics of the LC filter deteriorate.

The present disclosure is made to solve the above problem, and it is an object of the present disclosure to provide an LC filter of which deterioration of the insertion loss and attenuation characteristics are reduced.

To achieve the above object, an LC filter according to one aspect of the present disclosure includes a multilayer circuit board, an input electrode, an output electrode, a ground electrode, a first series arm capacitor, and a first parallel arm inductor. A radio-frequency signal is input to the input electrode. A radio-frequency signal is output from the output electrode. The ground electrode is made up of one or more layers of the multilayer circuit board. The first series arm capacitor is formed in the multilayer circuit board. The first series arm capacitor is disposed in a series arm path that connects the input electrode to the output electrode. The first parallel arm inductor is formed in the multilayer circuit board. The first parallel arm inductor is disposed in a parallel arm path that connects the ground electrode to a first node in the series arm path. When the multilayer circuit board is viewed in plan, of the first series arm capacitor and the first parallel arm inductor, only the first parallel arm inductor overlaps with the ground electrode.

When circuit elements that make up an LC filter are formed in a multilayer circuit board, as for a stray capacitance that is generated by each circuit element and a ground electrode formed in the multilayer circuit board, the circuit element disposed in a series arm between input and output terminals tends to generate a larger stray capacitance than the circuit element disposed in a parallel arm. In addition, of the circuit elements, capacitors need a larger electrode area than inductors, so a stray capacitance that is generated between each capacitor and the ground electrode is larger than a stray capacitance that is generated between each inductor and the ground electrode.

With the above configuration, the ground electrode is not formed at the location that overlaps with the first series arm capacitor formed in the series arm in a plan view, and the ground electrode is formed at the location that overlaps with the first parallel arm inductor formed in the parallel arm, so stray capacitances that are generated as a result of facing of the circuit elements formed in the multilayer circuit board to the ground electrode are reduced. Thus, no unnecessary coupling occurs in the series arm, so the deterioration of the insertion loss, the attenuation characteristics, and the like, of the LC filter is reduced.

The LC filter may further include a first variable capacitor disposed in the parallel arm path that connects the first node to the ground electrode, a capacitance value of the first variable capacitor being adjustable. The first parallel arm inductor and the first variable capacitor may be connected in series with each other.

With this configuration, the LC filter is able to change a plurality of filter characteristics, so filter characteristics compatible with a plurality of frequency bands are implemented by the single LC filter of this configuration. Thus, a front-end circuit in which the LC filter is disposed is miniaturized. In addition, as the number of filter characteristics to be changed increases, a design process for optimizing circuit elements becomes more complex. As the stray capacitance that is generated in the series arm increases, the design process becomes more complicated, and, in addition, no available frequency range is obtained as designed, so a malfunction can occur. With the above configuration, since no unnecessary coupling occurs in the series arm, a design process is simplified, so an available frequency range as designed is obtained.

The LC filter may further include a control line formed in the multilayer circuit board, the control line being configured to transmit a control signal for adjusting the capacitance value of the first variable capacitor. When the multilayer circuit board is viewed in plan, the control line may overlap with the ground electrode. When the multilayer circuit board is viewed in cross section, the ground electrode may be interposed between the first parallel arm inductor and the control line.

Thus, the control line faces the inductor disposed in the parallel arm across the ground electrode, and does not face the capacitor disposed in the series arm. Therefore, stray capacitances that are generated between the control line and the circuit elements are reduced, so noise that is superimposed on control signals to be transmitted through the control line is reduced. Thus, a misoperation of the first variable capacitor is avoided.

The first variable capacitor may be made up of a plurality of fixed capacitors of which capacitance values are fixed, and a switch configured to switch the combinations of the plurality of fixed capacitors. The plurality of fixed capacitors and the switch may be mounted on a surface of the multilayer circuit board.

With this configuration, the fixed capacitors that make up the first variable capacitor are mounted on the surface of the multilayer circuit board, so space for allowing the first series arm capacitor and the first parallel arm inductor to be formed is increased in the multilayer circuit board, and the design flexibility is improved.

The first variable capacitor may be made up of a plurality of fixed capacitors of which capacitance values are fixed, and a switch configured to switch combinations of the plurality of fixed capacitors. The plurality of fixed capacitors may be formed in the multilayer circuit board.

With this configuration, the first variable capacitor, the first series arm capacitor, and the first parallel arm inductor are formed in the multilayer circuit board, so low profile and miniaturization of the LC filter are possible.

The LC filter may further include a second parallel arm inductor formed in the multilayer circuit board, the second parallel arm inductor being disposed in a parallel arm path that connects a second node in the series arm path to the ground electrode, the second node being different from the first node, and a second variable capacitor disposed in the parallel arm path that connects the second node to the ground electrode, a capacitance value of the second variable capacitor being adjustable. The second parallel arm inductor and the second variable capacitor may be connected in series with each other.

With this configuration, the LC filter having excellent the steepness of a pass band and excellent attenuation characteristics is provided.

The LC filter may further include a second series arm capacitor formed in the multilayer circuit board, the second series arm capacitor being connected in series with the first series arm capacitor at the first node, a third series arm capacitor formed in the multilayer circuit board, the third series arm capacitor being connected in series with the first series arm capacitor at the second node, a first series arm inductor connected in parallel with the first series arm capacitor, a second series arm inductor connected in parallel with the second series arm capacitor, and a third series arm inductor connected in parallel with the third series arm capacitor.

With this configuration, no unnecessary coupling (stray capacitance) occurs in the series arm, so the deterioration of the insertion loss is reduced. In addition, for example, when a power amplifier is connected upstream of or downstream of the LC filter, distortion in a high-gain range of the power amplifier or harmonics are reduced. That is, generation of unnecessary spurious is reduced, so the signal to noise ratio of a radio-frequency signal that propagates through a radio-frequency front-end circuit including the LC filter is improved.

The LC filter may include a first series arm LC filter circuit connected between the input electrode and the output electrode, a first parallel arm LC filter circuit connected to the ground electrode and the first node that is one end of the first series arm LC filter circuit, and a second parallel arm LC filter circuit connected to the ground electrode and a second node that is an other end of the first series arm LC filter circuit. The first parallel arm LC filter circuit may be made up of the first parallel arm inductor and the first variable capacitor, and the first parallel arm inductor and the first variable capacitor may be connected in series with each other. The second parallel arm LC filter circuit may be made up of the second parallel arm inductor and the second variable capacitor, and the second parallel arm inductor and the second variable capacitor may be connected in series with each other. The first series arm LC filter circuit may be made up of the first series arm capacitor, an LC series circuit, and an LC parallel circuit. The LC series circuit may include a second series arm capacitor and a first series arm inductor connected in series with each other between the first node and the second node. The LC parallel circuit may include a third parallel arm inductor and a third variable capacitor connected in parallel with each other between the ground electrode and a connection node between the second series arm capacitor and the first series arm inductor, a capacitance value of the third variable capacitor being adjustable.

With this configuration, the LC filter having the above configuration is applicable to a system for TV white space (TVWS). In this case, since no unnecessary coupling (stray capacitance) occurs in the series arm, the deterioration of the insertion loss is reduced. Thus, unnecessary harmonic spurious is reduced.

At least two of the first parallel arm inductor, the second parallel arm inductor, and the third parallel arm inductor may be coupled by a magnetic field.

With this configuration, the steepness of the pass band characteristics is improved, so the number of channels usable in a system for TVWS is increased.

The multilayer circuit board may include a ground electrode layer. The ground electrode layer may include a ground electrode formation region and a ground electrode opening region. The ground electrode formation region may be a region in which the ground electrode is formed all over. The ground electrode opening region may be a region surrounded by the ground electrode formation region in the plan view. The ground electrode opening region may be a region in which the ground electrode is not formed. When the ground electrode layer is viewed in plan, the first series arm capacitor may be contained in the ground electrode opening region, and the first parallel arm inductor may be contained in the ground electrode formation region.

With the above configuration, the first series arm capacitor is contained in the ground electrode opening region in a plan view, and the first parallel arm inductor is contained in the ground electrode formation region in a plan view, so stray capacitances that are generated as a result of facing of the circuit elements that are formed in the multilayer circuit board to the ground electrode are reduced. Thus, no unnecessary coupling occurs in the series arm, so the deterioration of the frequency characteristics, such as the insertion loss and attenuation characteristics, of the LC filter is reduced.

A radio-frequency front-end circuit according to one aspect of the present disclosure includes the above-described LC filter, a transmitting filter element, a receiving filter element, and a branching filter configured to output a radio-frequency reception signal from an antenna element to the receiving filter element and output a radio-frequency transmission signal, passed through the transmitting filter element, to the antenna element.

With this configuration, no unnecessary coupling (stray capacitance) occurs in the series arm of the LC filter, so the deterioration of the insertion loss and attenuation characteristics is reduced. In addition, the radio-frequency front-end circuit, in which distortion in a high-gain range of a power amplifier is reduced, is provided.

A communication device according to one aspect of the present disclosure includes the above-described radio-frequency front-end circuit, and an RF signal processing circuit configured to output a radio-frequency transmission signal to the radio-frequency front-end circuit and receive input of a radio-frequency reception signal from the radio-frequency front-end circuit.

With this configuration, no unnecessary coupling (stray capacitance) occurs in the series arm of the LC filter, so the deterioration of the insertion loss and attenuation characteristics is reduced. In addition, the communication device, in which distortion in a high-gain range of a power amplifier is reduced, is provided.

According to the present disclosure, it is possible to provide an LC filter of which the deterioration of the insertion loss and attenuation characteristics is reduced.

DETAILED DESCRIPTION OF THE DISCLOSURE

Figure 1A:
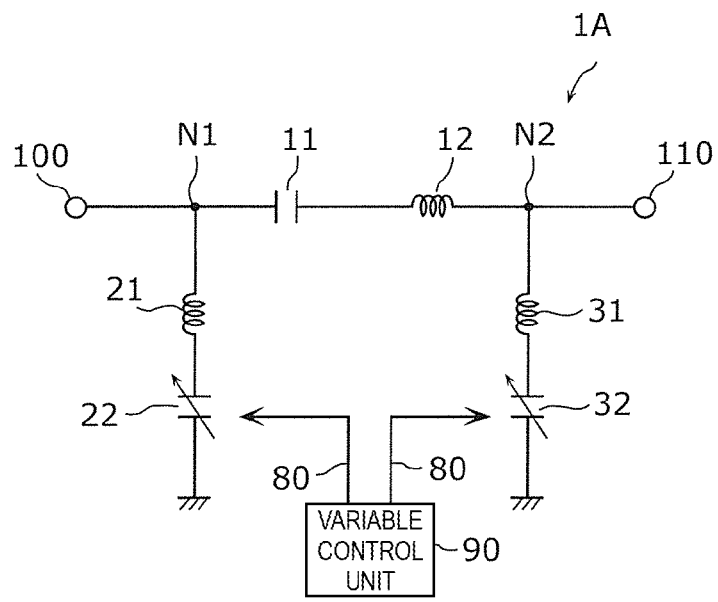
FIG. 1A is a circuit configuration diagram of an LC filter according to a first embodiment.

Hereinafter, an embodiment of the present disclosure will be described in detail with reference to the embodiments and the associated drawings. Any of the embodiments that will be described below describes a comprehensive or specific example. Numeric values, shapes, materials, elements, disposition and connection modes of the elements, and the like, that will be described below are illustrative, and are not intended to limit the present disclosure. Of the elements in the following embodiments, the elements not included in the independent claim will be described as optional elements. In addition, the size or size ratio of elements shown in the drawings is not necessarily strict.

First Embodiment

[1.1 Circuit Configuration of LC Filter 1A]

FIG. 1A is a circuit configuration diagram of an LC filter 1A according to a first embodiment. The LC filter 1A shown in the drawing includes a radio-frequency input terminal 100, a radio-frequency output terminal 110, a series arm capacitor 11, a series arm inductor 12, parallel arm inductors 21, 31, and variable capacitors 22, 32. In addition, the LC filter 1A further includes a variable control unit 90 and control lines 80. The variable control unit 90 does not need to be included in the LC filter 1A. The variable control unit 90 may be included in, for example, a radio-frequency front-end circuit or a communication device, other than the LC filter 1A.

The radio-frequency input terminal 100, the radio-frequency output terminal 110, the series arm capacitor 11, the series arm inductor 12, the parallel arm inductors 21, 31, and the control lines 80 are formed in a multilayer circuit board. The multilayer circuit board is a resin multilayer circuit board, or the like, formed by laminating, for example, low-temperature cofire ceramic substrates (LTCC substrates) or glass epoxy substrates. In addition, the variable capacitors 22, 32 and the other circuit elements may be coated with epoxy resin or another material on the multilayer circuit board.

The radio-frequency input terminal 100 is, for example, an input electrode formed on the back surface of the multilayer circuit board. The radio-frequency output terminal 110 is, for example, an output electrode formed on the back surface of the multilayer circuit board. A ground electrode is formed in the multilayer circuit board. The ground electrode is made up of one or more layers of the multilayer circuit board.

The series arm capacitor 11 is a first series arm capacitor formed in the multilayer circuit board and disposed in a series arm path that connects the input electrode (radio-frequency input terminal 100) to the output electrode (radio-frequency output terminal 110).

The series arm inductor 12 is disposed in the series arm path, and is connected in series with the series arm capacitor 11.

The parallel arm inductor 21 is a first parallel arm inductor formed in the multilayer circuit board and disposed in a parallel arm path that connects a node N1 (first node) in the series arm path to the ground electrode.

The parallel arm inductor 31 is a second parallel arm inductor formed in the multilayer circuit board and disposed in a parallel arm path that connects a node N2 (second node) in the series arm path to the ground electrode.

The variable capacitor 22 is a first variable capacitor disposed in the parallel arm path that connects the node N1 to the ground electrode. The capacitance value of the first variable capacitor is adjustable. In addition, the parallel arm inductor 21 and the variable capacitor 22 are connected in series with each other between the node N1 and the ground electrode.

The variable capacitor 32 is a second variable capacitor disposed in the parallel arm path that connects the node N2 to the ground electrode. The capacitance value of the second variable capacitor is adjustable. In addition, the parallel arm inductor 31 and the variable capacitor 32 are connected in series with each other between the node N2 and the ground electrode.

The variable control unit 90 is a control unit that controls the capacitance value of each of the variable capacitors 22, 32. Specifically, the variable control unit 90 outputs a control signal for adjusting the capacitance value of the variable capacitor 22 or a control signal for changing the capacitance value of the variable capacitor 32 to a corresponding one of the control lines 80.

Each of the control lines 80 is a wire formed in the multilayer circuit board. The wire transmits the control signal for adjusting the capacitance value of a corresponding one of the variable capacitors 22, 32 to the corresponding one of the variable capacitors 22, 32.

In the above configuration, when the multilayer circuit board is viewed in plan, of the series arm capacitor 11, the series arm inductor 12, and the parallel arm inductors 21, 31, only the parallel arm inductors 21, 31 overlap with the ground electrode.

In general, when circuit elements that make up an LC filter are formed in a multilayer circuit board, as for a stray capacitance that is generated by each circuit element and a ground electrode formed in the multilayer circuit board, the circuit element disposed in a series arm between input and output terminals tends to generate a larger stray capacitance than the circuit element disposed in a parallel arm. In addition, of the circuit elements, capacitors (planar electrodes) need a larger electrode area than inductors (planar coils), so a stray capacitance that is generated between each capacitor and the ground electrode is larger than a stray capacitance that is generated between each inductor and the ground electrode.

With the above-described configuration, when the multilayer circuit board is viewed in plan, the ground electrode is not formed at the location that overlaps with the series arm capacitor 11 formed in the series arm, and the ground electrode is formed at the locations that overlap with the parallel arm inductors 21, 31 formed in the parallel arms. Therefore, stray capacitances that are generated as a result of facing of the circuit elements formed in the multilayer circuit board to the ground electrode are reduced. Thus, no unnecessary coupling occurs in the series arm, so the deterioration of the frequency characteristics, such as the insertion loss and attenuation characteristics, of the LC filter is reduced. In addition, when the LC filter 1A is disposed in a radio-frequency front-end circuit having a power amplifier, distortion in a high-gain range of the power amplifier is reduced.

In addition, with the variable capacitors 22, 32, the LC filter 1A is able to change a plurality of filter characteristics, so filter characteristics compatible with a plurality of frequency bands are implemented with the single LC filter 1A of the present configuration. Thus, a front-end circuit in which the LC filter 1A is disposed is miniaturized. In addition, as the number of filter characteristics to be changed increases, a design process for optimizing circuit elements becomes more complex. As the stray capacitance that is generated in the series arm increases, the design process becomes more complicated, and, in addition, no available frequency range is obtained as designed, so a malfunction can occur. With the above configuration, since no unnecessary coupling occurs in the series arm, a design process is simplified, so an available frequency range as designed is obtained.

In addition, preferably, when the multilayer circuit board is viewed in plan, the control lines 80 overlap with the ground electrode, and, when the multilayer circuit board is viewed in cross section, the ground electrode is interposed between the parallel arm inductor 21 and the control lines 80 and between the parallel arm inductor 31 and the control lines 80.

Thus, the control lines 80 face the parallel arm inductor 21 or the parallel arm inductor 31, disposed in a corresponding one of the parallel arms across the ground electrode, and do not face the series arm capacitor 11 disposed in the series arm. Therefore, stray capacitances that are generated between the control lines 80 and the circuit elements are reduced, so noise that is superimposed on control signals to be transmitted through the control lines 80 is reduced. Thus, a misoperation of the variable capacitors 22, 32 is avoided.

In the present embodiment, the LC filter 1A is a variable-frequency LC filter including the variable capacitors 22, 32. Instead, the present disclosure also encompasses a circuit configuration that does not include the variable capacitors 22, 32. With this circuit configuration as well, when the multilayer circuit board is viewed in plan, the ground electrode is not formed at the location that overlaps with the series arm capacitor 11, and the ground electrode is formed at the locations that overlap with the parallel arm inductors 21, 31, so stray capacitances are reduced. Thus, no unnecessary coupling occurs in the series arm, so the deterioration of the frequency characteristics, such as the insertion loss and attenuation characteristics, of the fixed-frequency LC filter is reduced.

[1.2 Bandpass Characteristics of LC Filter 1A]

Figure 1B:
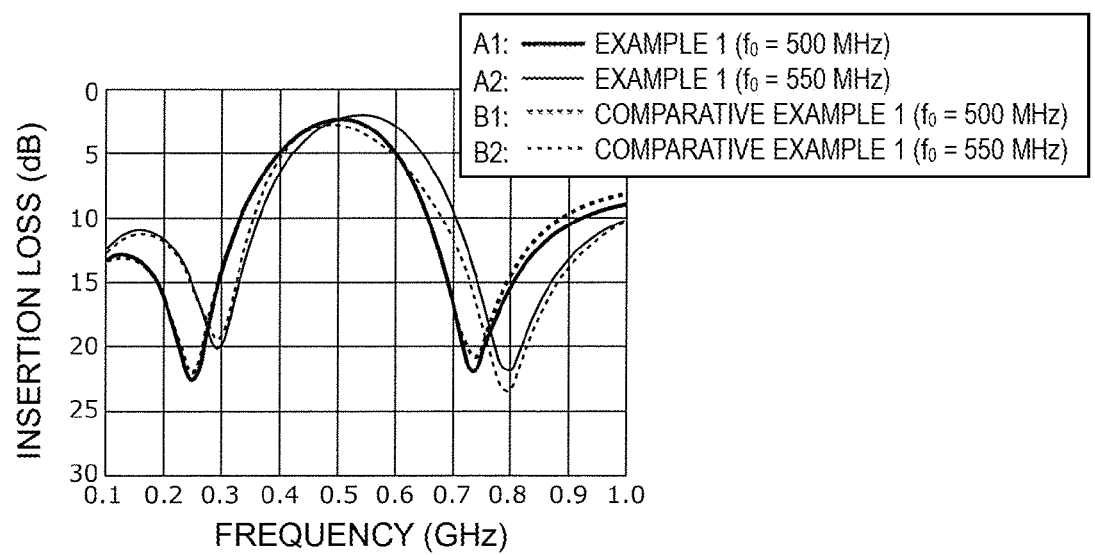
FIG. 1B is a comparison graph between the bandpass characteristics of the LC filter according to the first embodiment and the bandpass characteristics of an LC filter according to Comparative Example 1.

FIG. 1B is a comparison graph between the bandpass characteristics of the LC filter according to the first embodiment (Example 1) and the bandpass characteristics of an LC filter according to Comparative Example 1.

In the graph, two filter characteristics A1, A2 of the variable-frequency LC filter 1A according to the first embodiment (Example 1) are shown. The filter characteristics A1 have a center frequency f0 of 500 MHz in a pass band (wide solid line). The filter characteristics A2 have a center frequency f0 of 550 MHz in a pass band (narrow solid line).

In addition, in the graph, two filter characteristics B1, B2 of the variable-frequency LC filter according to Comparative Example 1 are shown. The filter characteristics B1 have a center frequency f0 of 500 MHz in a pass band (wide dashed line). The filter characteristics B2 have a center frequency f0 of 550 MHz in a pass band (narrow dashed line).

The filter characteristics A1 and filter characteristics A2 of the LC filter 1A according to Example 1 are switched by the variable control unit 90 and the control lines 80. The filter characteristics B1 and filter characteristics B2 of the LC filter according to Comparative Example 1 are also switched by the variable control unit 90 and the control lines 80.

The LC filter according to Comparative Example 1 differs from the LC filter 1A according to Example 1 in that, when the multilayer circuit board is viewed in plan, the series arm capacitor 11 overlaps with the ground electrode.

According to the comparison between the bandpass characteristics in FIG. 1B, each of the filter characteristics A1 and the filter characteristics A2 ensures desired insertion loss in the pass band and desired attenuation at attenuation poles near the pass band. In contrast to this, the filter characteristics B2 have deteriorated insertion loss in the pass band as compared to the filter characteristics A2, and do not have a sufficient f0 shift relative to the filter characteristics B1. Furthermore, the filter characteristics B1 have deteriorated attenuation at attenuation poles as compared to the filter characteristics A1.

The differences between the filter characteristics are due to whether the series arm capacitor 11 overlaps with the ground electrode.

[1.3 Packaging Configuration of LC Filter 1A]

An example of a packaging configuration in the case where the LC filter 1A according to the first embodiment is made up of a multilayer circuit board will be described.

Figure 2A:
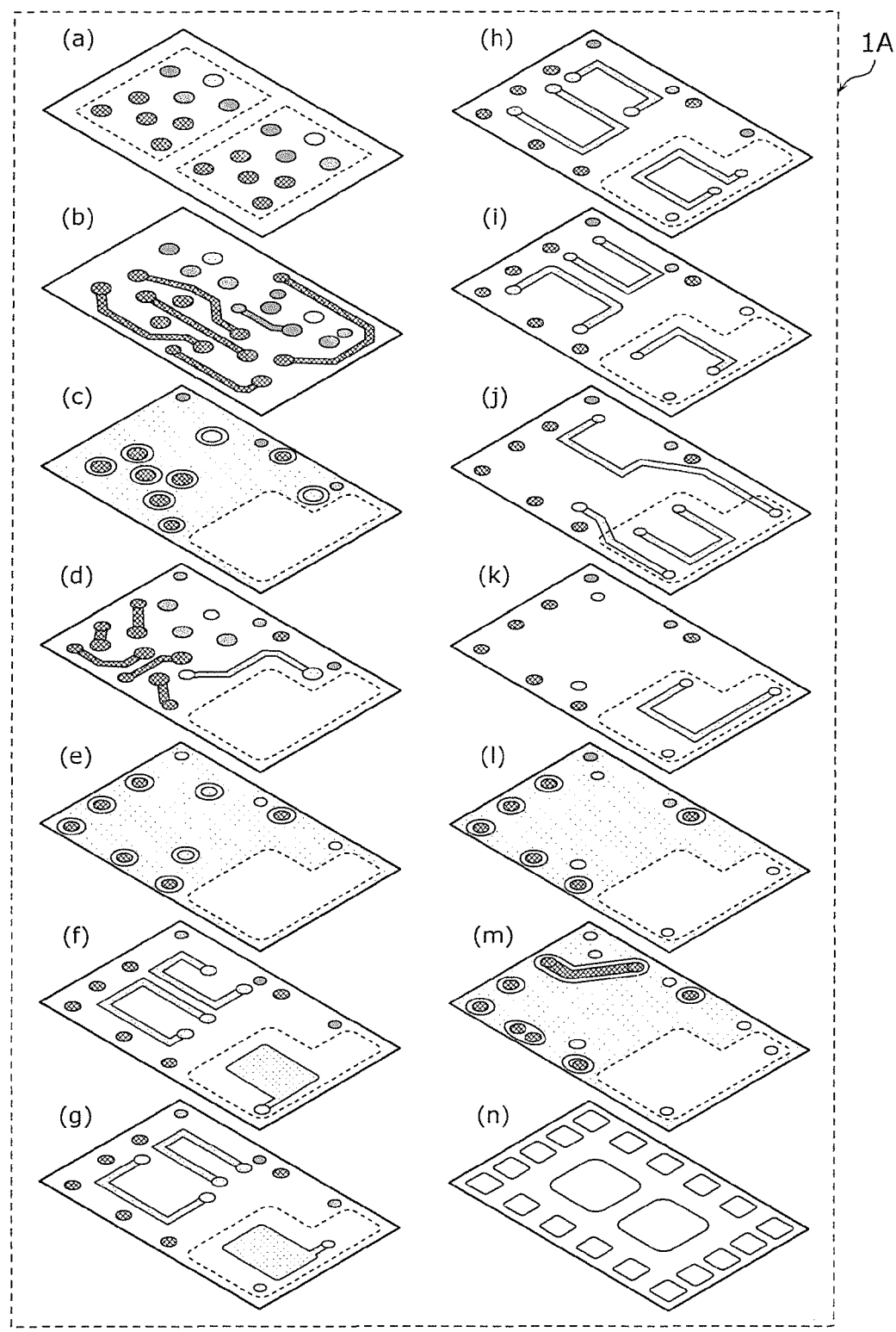
FIG. 2A is an exploded perspective view showing a layer configuration of the LC filter according to the first embodiment.
Figure 2B:
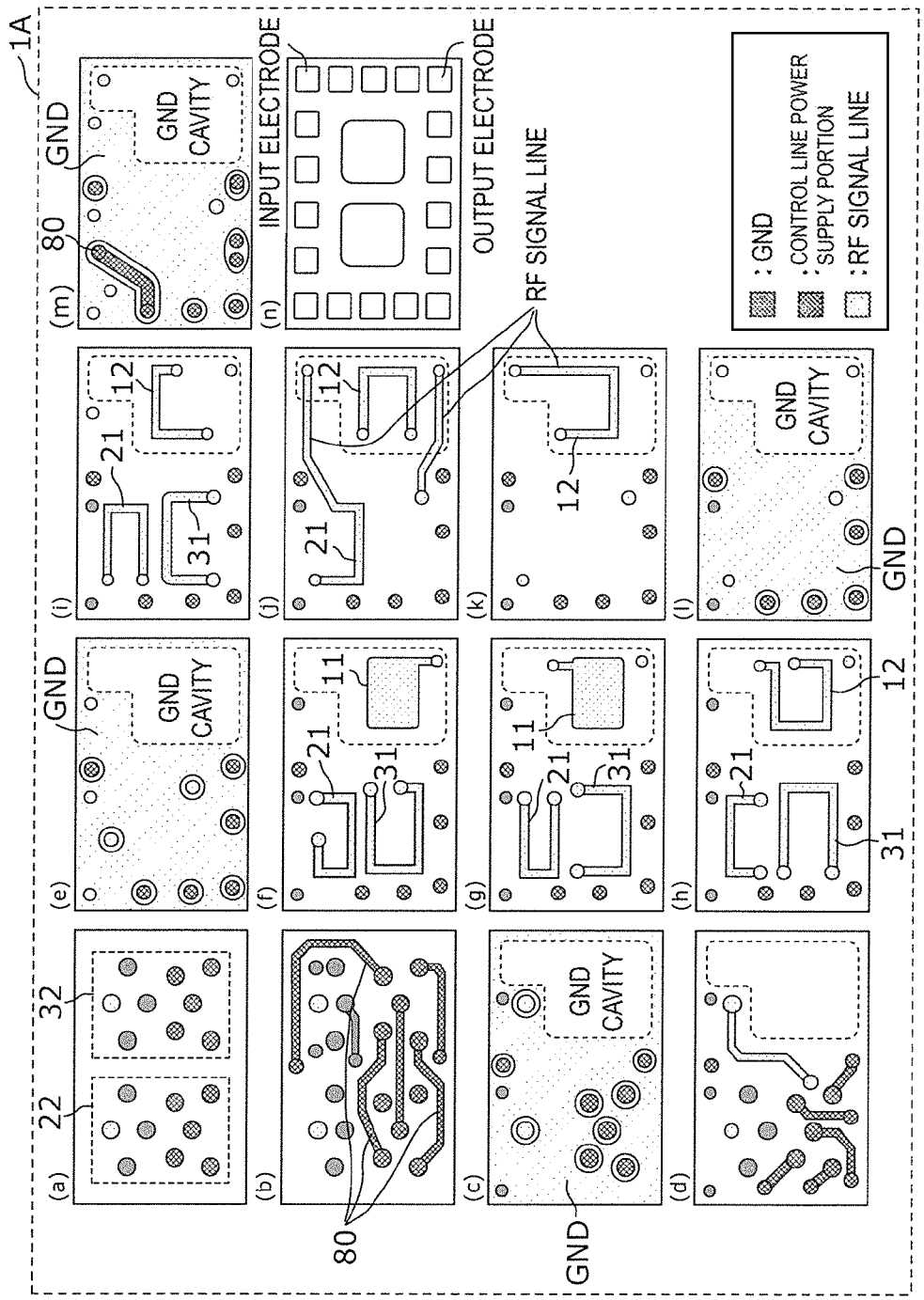
FIG. 2B is an exploded plan view showing the layer configuration of the LC filter according to the first embodiment.

FIG. 2A is an exploded perspective view showing a layer configuration of the LC filter 1A according to the first embodiment. In addition, FIG. 2B is an exploded plan view showing the layer configuration of the LC filter 1A according to the first embodiment. As shown in FIG. 2A and FIG. 2B, the LC filter 1A is formed in the multilayer circuit board in which a plurality of layers is laminated.

As shown in FIG. 2A, in the LC filter 1A, a layer (n), a layer (m), a layer (l), a layer (k), a layer (j), a layer (i), a layer (h), a layer (g), a layer (f), a layer (e), a layer (d), a layer (c), a layer (b), and a layer (a) are laminated in order from the bottom. In addition, as shown in FIG. 2A and FIG. 2B, a conductive pattern and via electrodes are shown in each of the layer (a) to the layer (n). Hereinafter, the electrode layout of each layer will be described.

Electrodes that are connected to the variable capacitors 22, 32 are formed in the layer (a). In the present embodiment, the variable capacitors 22, 32 are mounted on the surface of the layer (a) that is a top layer.

More specifically, the variable capacitors 22, 32 include a plurality of fixed capacitors each having a fixed capacitance value, and a switch that switches combinations of the plurality of fixed capacitors (not shown). The plurality of fixed capacitors and the switch are mounted on the surface of the multilayer circuit board. The variable capacitors 22, 32 are connected to the control lines 80, ground electrode formation regions GND, and the parallel arm inductors 21, 31 in the multilayer circuit board via electrodes formed on the surface of the layer (a) and the via electrodes that connect the electrodes between the layers.

With the above configuration in which the variable capacitors 22, 32 are mounted on the surface of the multilayer circuit board, space for allowing the series arm capacitor 11, the series arm inductor 12, and the parallel arm inductors 21, 31 to be formed is increased in the multilayer circuit board, so the design flexibility is improved.

Alternatively, the plurality of fixed capacitors may be formed in the multilayer circuit board. In this case, the variable capacitors 22, 32, the series arm capacitor 11, the series arm inductor 12, and the parallel arm inductors 21, 31 are formed in the multilayer circuit board, so low profile and miniaturization of the LC filter are possible.

The control lines 80, a via electrode pattern, and an RF via electrodes are formed in the layer (b). The control lines 80 are connected to the variable capacitors 22, 32. The via electrode pattern connects the ground electrode formation region GND of the layer (c) to the variable capacitors 22, 32. The RF via electrodes connect the variable capacitors 22, 32 to the parallel arm inductors 21, 31.

The layer (c) is a ground electrode layer. The ground electrode formation region GND that is connected to the variable capacitors 22, 32 is formed in the layer (c). The layer (c) includes the ground electrode formation region GND and a ground electrode opening region (GND cavity in FIG. 2B). In the ground electrode formation region GND, the ground electrode pattern is formed all over. The ground electrode opening region is a region surrounded by the ground electrode formation region in a plan view. In the ground electrode opening region, the ground electrode pattern is not formed.

The control lines 80 and ground via electrodes are formed in the layer (d). The control lines 80 are connected to the variable capacitors 22, 32. The ground via electrodes connect the ground electrode formation region GND of the layer (c) to a ground electrode formation region GND of the layer (e).

The layer (e) is a ground electrode layer. The layer (e) includes the ground electrode formation region GND and a ground electrode opening region (GND cavity in FIG. 2B). In the ground electrode formation region GND, a ground electrode pattern is formed all over. The ground electrode opening region is a region surrounded by the ground electrode formation region GND in a plan view. In the ground electrode opening region, the ground electrode pattern is not formed.

Coil patterns of the parallel arm inductors 21, 31 and an electrode pattern of the series arm capacitor 11 are formed in the layer (f).

Coil patterns of the parallel arm inductors 21, 31 and an electrode pattern of the series arm capacitor 11 are formed in the layer (g).

Coil patterns of the parallel arm inductors 21, 31 and a coil pattern of the series arm inductor 12 are formed in the layer (h).

Coil patterns of the parallel arm inductors 21, 31 and a coil pattern of the series arm inductor 12 are formed in the layer (i).

A coil pattern of the parallel arm inductor 21, a coil pattern of the series arm inductor 12, and RF signal lines are formed in the layer (j). One of the RF signal lines is connected from the parallel arm inductor 21 to the input electrode of the layer (n). The other one of the RF signal lines is connected from the parallel arm inductor 31 to the output electrode of the layer (n).

A coil pattern of the series arm inductor 12 and an RF signal line are formed in the layer (k). The RF signal line is connected from the series arm inductor 12 to the input electrode of the layer (n).

The layer (l) is a ground electrode layer. The layer (l) includes a ground electrode formation region GND and a ground electrode opening region (GND cavity in FIG. 2B). In the ground electrode formation region GND, a ground electrode pattern is formed all over. The ground electrode opening region is a region surrounded by the ground electrode formation region GND in a plan view. In the ground electrode opening region, the ground electrode pattern is not formed.

The layer (m) is a ground electrode layer. The layer (m) includes a ground electrode formation region GND and a ground electrode opening region (GND cavity in FIG. 2B). In the ground electrode formation region GND, a ground electrode pattern is formed all over. The ground electrode opening region is a region surrounded by the ground electrode formation region GND in a plan view. In the ground electrode opening region, the ground electrode pattern is not formed.

An electrode pattern on the back surface of the multilayer circuit board is shown in the layer (n). The input electrode (radio-frequency input terminal 100), the output electrode (radio-frequency output terminal 110), and electrodes that are connected to the control lines 80 are formed in the layer (n).

When the multilayer circuit board is viewed in plan, the series arm capacitor 11 is contained in (overlaps with) the ground electrode opening regions (GND cavity in FIG. 2B) respectively provided in the layer (c), the layer (e), the layer (l), and the layer (m), and the parallel arm inductors 21, 31 are contained in (overlap with) the ground electrode formation regions GND.

With the above configuration, stray capacitances that are generated as a result of facing of the circuit elements formed in the multilayer circuit board to the ground electrode are reduced. Thus, no unnecessary coupling occurs in the series arm, so the deterioration of the frequency characteristics, such as the insertion loss and attenuation characteristics, of the LC filter 1A is reduced.

Second Embodiment

[2.1 Circuit Configuration of LC Filter 1B]

Figure 3A:
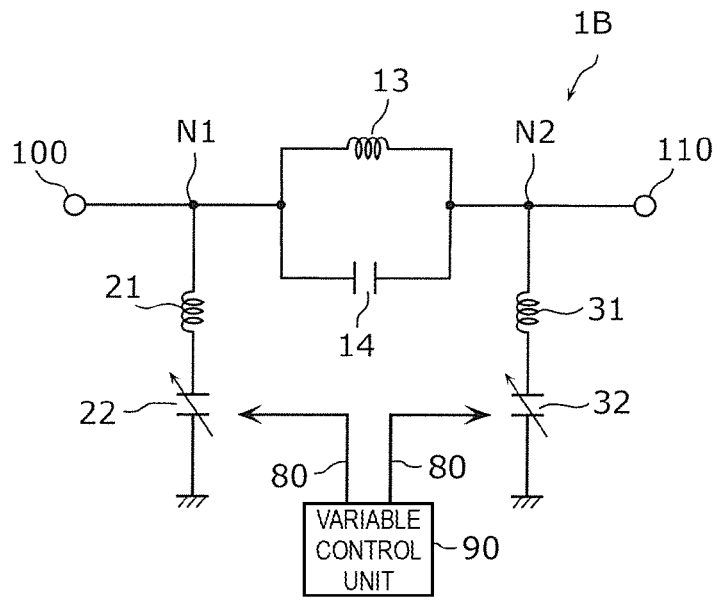
FIG. 3A is a circuit configuration diagram of an LC filter according to a second embodiment.

FIG. 3A is a circuit configuration diagram of an LC filter 1B according to a second embodiment. The LC filter 1B shown in the drawing includes the radio-frequency input terminal 100, the radio-frequency output terminal 110, a series arm capacitor 14, a series arm inductor 13, the parallel arm inductors 21, 31, and the variable capacitors 22, 32. In addition, the LC filter 1B further includes the variable control unit 90 and the control lines 80. The variable control unit 90 does not need to be included in the LC filter 1B. The variable control unit 90 may be included in, for example, a radio-frequency front-end circuit or a communication device, other than the LC filter 1B.

The LC filter 1B according to the present embodiment differs from the LC filter 1A according to the first embodiment in the circuit configuration of the series arm. Hereinafter, the description of portions identical with those of the LC filter 1A is omitted, and different portions will be mainly described.

The radio-frequency input terminal 100, the radio-frequency output terminal 110, the series arm capacitor 14, the series arm inductor 13, the parallel arm inductors 21, 31, and the control lines 80 are formed in the multilayer circuit board. The multilayer circuit board is a resin multilayer circuit board, or the like, formed by laminating, for example, low-temperature cofire ceramic substrates (LTCC substrates) or glass epoxy substrates. In addition, the variable capacitors 22, 32 and the other circuit elements may be coated with epoxy resin or another material on the multilayer circuit board.

The series arm capacitor 14 is a first series arm capacitor formed in the multilayer circuit board and disposed in a series arm path that connects the input electrode (radio-frequency input terminal 100) to the output electrode (radio-frequency output terminal 110).

In the above configuration, when the multilayer circuit board is viewed in plan, among the series arm capacitor 14, the series arm inductor 13, and the parallel arm inductors 21, 31, only the parallel arm inductors 21, 31 overlap with the ground electrode.

With the above-described configuration, when the multilayer circuit board is viewed in plan, the ground electrode is not formed at the location that overlaps with the series arm capacitor 14 formed in the series arm, and the ground electrode is formed at the locations that overlap with the parallel arm inductors 21, 31 formed in the parallel arms. Therefore, stray capacitances that are generated as a result of facing of the circuit elements formed in the multilayer circuit board to the ground electrode are reduced. Thus, no unnecessary coupling occurs in the series arm, so the deterioration of the frequency characteristics, such as the insertion loss and attenuation characteristics, of the LC filter 1B is reduced. In addition, when the LC filter 1B is disposed in a radio-frequency front-end circuit having a power amplifier, distortion in a high-gain range of the power amplifier is reduced or deterioration of harmonic ($2 \times f0/3 \times f0$) characteristics is reduced. That is, generation of unnecessary spurious is reduced, so the signal to noise ratio of a radio-frequency signal that propagates through the radio-frequency front-end circuit is improved.

In the present embodiment, the LC filter 1B is a variable-frequency LC filter including the variable capacitors 22, 32. Instead, the present disclosure also encompasses a circuit configuration that does not include the variable capacitors 22, 32. With this circuit configuration as well, when the multilayer circuit board is viewed in plan, the ground electrode is not formed at the location that overlaps with the series arm capacitor 14, and the ground electrode is formed at the locations that overlap with the parallel arm inductors 21, 31, so stray capacitances are reduced. Thus, no unnecessary coupling occurs in the series arm, so the deterioration of the frequency characteristics, such as the insertion loss and attenuation characteristics, of the fixed-frequency LC filter is reduced.

[2.2 Bandpass Characteristics of LC Filter 1B]

Figure 3B:
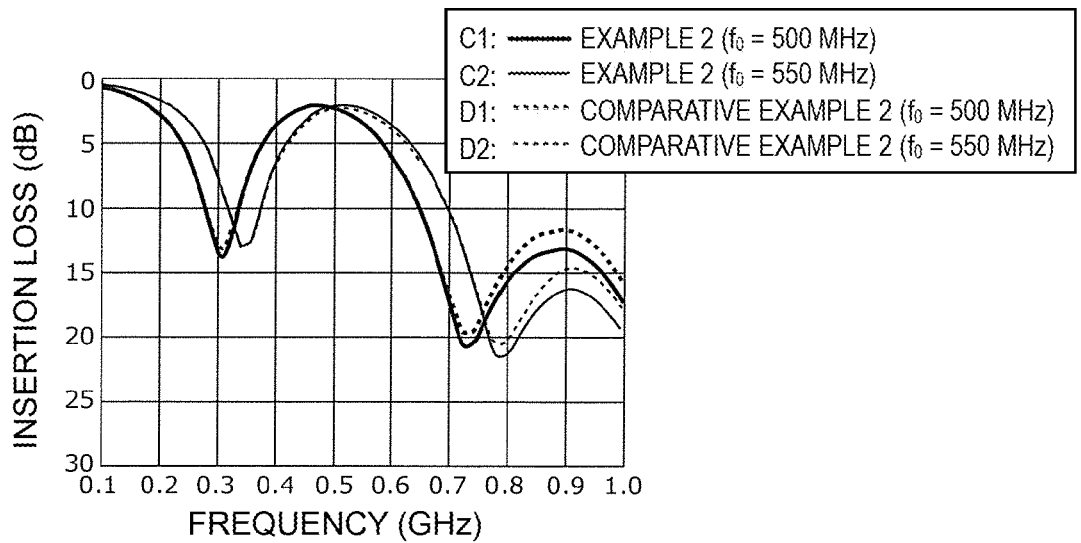
FIG. 3B is a comparison graph between the bandpass characteristics of the LC filter according to the second embodiment and the bandpass characteristics of an LC filter according to Comparative Example 2.

FIG. 3B is a comparison graph between the bandpass characteristics of the LC filter according to the second embodiment (Example 2) and the bandpass characteristics of an LC filter according to Comparative Example 2.

In the graph, two filter characteristics C1, C2 of the variable-frequency LC filter 1B according to the second embodiment (Example 2) are shown. The filter characteristics C1 have a center frequency f0 of 500 MHz in a pass band (wide solid line). The filter characteristics C2 have a center frequency f0 of 550 MHz in a pass band (narrow solid line).

In addition, in the graph, two filter characteristics D1, D2 of the variable-frequency LC filter according to Comparative Example 2 are shown. The filter characteristics D1 have a center frequency f0 of 500 MHz in a pass band (wide dashed line). The filter characteristics D2 have a center frequency f0 of 550 MHz in a pass band (narrow dashed line).

The filter characteristics C1 and filter characteristics C2 of the LC filter 1B according to Example 2 are switched by the variable control unit 90 and the control lines 80. The filter characteristics D1 and filter characteristics D2 of the LC filter according to Comparative Example 2 are also switched by the variable control unit 90 and the control lines 80.

The LC filter according to Comparative Example 2 differs from the LC filter 1B according to Example 2 in that, when the multilayer circuit board is viewed in plan, the series arm capacitor 14 overlaps with the ground electrode.

According to the comparison between the bandpass characteristics in FIG. 3B, each of the filter characteristics C1 and the filter characteristics C2 ensures desired insertion loss in the pass band and desired attenuation at attenuation poles near the pass band. In contrast to this, the filter characteristics D2 have deteriorated insertion loss in the pass band as compared to the filter characteristics C2. Furthermore, the filter characteristics D1, D2 have deteriorated attenuation on the higher frequency side than the pass band as compared to the filter characteristics C1, C2.

The differences between the filter characteristics are due to whether the series arm capacitor 14 overlaps with the ground electrode.

[2.3 Packaging Configuration of LC Filter 1B]

A packaging layout in the multilayer circuit board of the LC filter 1B according to the present embodiment is prepared based on a similar design concept to the packaging layout in the multilayer circuit board of the LC filter 1A according to the first embodiment, so the details of a conductor layout in each layer are omitted.

When the multilayer circuit board is viewed in plan, the series arm capacitor 14 is contained in the ground electrode opening regions provided in the ground electrode layers, and the parallel arm inductors 21, 31 are contained in the ground electrode formation regions GND.

With the above configuration, stray capacitances that are generated as a result of facing of the circuit elements formed in the multilayer circuit board to the ground electrode are reduced. Thus, no unnecessary coupling occurs in the series arm, so the deterioration of the frequency characteristics, such as the insertion loss and attenuation characteristics, of the LC filter 1B is reduced.

[2.4 Circuit Configuration of LC Filter 1C]

Figure 4A:
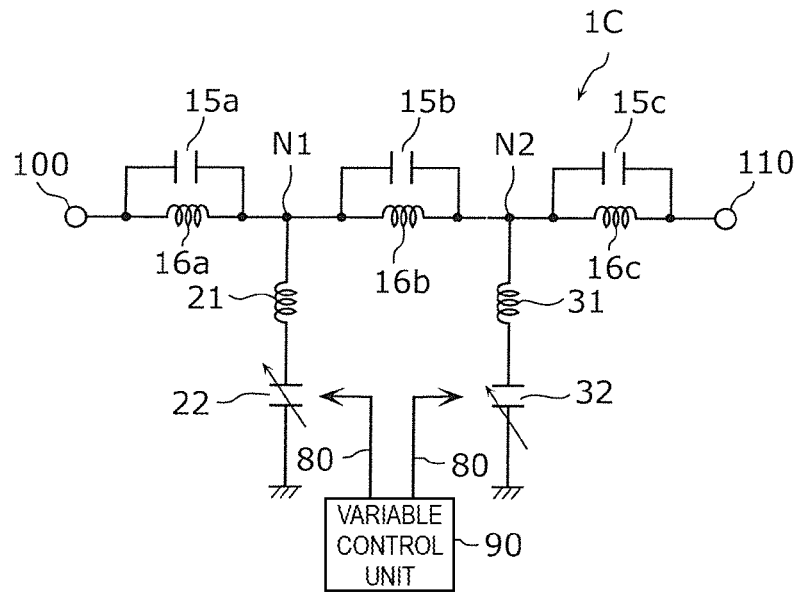
FIG. 4A is a circuit configuration diagram of an LC filter according to an alternative embodiment to the second embodiment.

FIG. 4A is a circuit configuration diagram of an LC filter 1C according to an alternative embodiment to the second embodiment. The LC filter 1C according to the present alternative embodiment is the one in which the basic circuit of the LC filter 1B according to the second embodiment is employed as a communication circuit for Internet of things (IoT). The LC filter 1C shown in the drawing includes the radio-frequency input terminal 100, the radio-frequency output terminal 110, series arm capacitors 15a, 15b, 15c, series arm inductors 16a, 16b, 16c, the parallel arm inductors 21, 31, and the variable capacitors 22, 32. In addition, the LC filter 1C further includes the variable control unit 90 and the control lines 80. The variable control unit 90 does not need to be included in the LC filter 1C. The variable control unit 90 may be included in, for example, a radio-frequency front-end circuit or a communication device, other than the LC filter 1C.

The LC filter 1C according to the present embodiment differs from the LC filter 1B according to the second embodiment in the circuit configuration of the series arm. Hereinafter, the description of portions identical with those of the LC filter 1B is omitted, and different portions will be mainly described.

The radio-frequency input terminal 100, the radio-frequency output terminal 110, the series arm capacitors 15a, 15b, 15c, the series arm inductors 16a, 16b, 16c, the parallel arm inductors 21, 31, and the control lines 80 are formed in the multilayer circuit board. The multilayer circuit board is a resin multilayer circuit board, or the like, formed by laminating, for example, low-temperature cofire ceramic substrates (LTCC substrates) or glass epoxy substrates. In addition, the variable capacitors 22, 32 and the other circuit elements may be coated with epoxy resin or another material on the multilayer circuit board.

The series arm capacitor 15b is a first series arm capacitor formed in the multilayer circuit board and disposed in a series arm path that connects the input electrode (radio-frequency input terminal 100) to the output electrode (radio-frequency output terminal 110).

The series arm capacitor 15a is a second series arm capacitor formed in the multilayer circuit board and connected in series with the series arm capacitor 15b at the node N1.

The series arm capacitor 15c is a third series arm capacitor formed in the multilayer circuit board and connected in series with the series arm capacitor 15b at the node N2.

The series arm inductor 16a is a second series arm inductor connected in parallel with the series arm capacitor 15a. The series arm inductor 16b is a first series arm inductor connected in parallel with the series arm capacitor 15b. The series arm inductor 16c is a third series arm inductor connected in parallel with the series arm capacitor 15c.

In the above configuration, when the multilayer circuit board is viewed in plan, of the series arm capacitors 15a, 15b, 15c, the series arm inductors 16a, 16b, 16c, and the parallel arm inductors 21, 31, only the parallel arm inductors 21, 31 overlap with the ground electrode.

With the above-described configuration, when the multilayer circuit board is viewed in plan, the ground electrode is not formed at the locations that overlap with the series arm capacitors 15a, 15b, 15c formed in the series arm, and the ground electrode is formed at the locations that overlap with the parallel arm inductors 21, 31 formed in the parallel arms. Therefore, stray capacitances that are generated as a result of facing of the circuit elements formed in the multilayer circuit board to the ground electrode are reduced. Thus, no unnecessary coupling occurs in the series arm, so the deterioration of the frequency characteristics, such as the insertion loss and attenuation characteristics, of the LC filter is reduced. In addition, when the LC filter 1C is disposed in a radio-frequency front-end circuit having a power amplifier, distortion in a high-gain range of the power amplifier is reduced or deterioration of harmonic ($2 \times f0/3 \times f0$) characteristics is reduced. That is, generation of unnecessary spurious is reduced, so the signal to noise ratio of a radio-frequency signal that propagates through the radio-frequency front-end circuit is improved.

In the present embodiment, the LC filter 1C is a variable-frequency LC filter including the variable capacitors 22, 32. Instead, the present disclosure also encompasses a circuit configuration that does not include the variable capacitors 22, 32. With this circuit configuration as well, when the multilayer circuit board is viewed in plan, the ground electrode is not formed at the locations that overlap with the series arm capacitors 15a, 15b, 15c, and the ground electrode is formed at the locations that overlap with the parallel arm inductors 21, 31, so stray capacitances are reduced.

Thus, no unnecessary coupling occurs in the series arm, so the deterioration of the frequency characteristics, such as the insertion loss and attenuation characteristics, of the fixed-frequency LC filter is reduced.

[2.5 Bandpass Characteristics of LC Filter 1C]

Figure 4B:
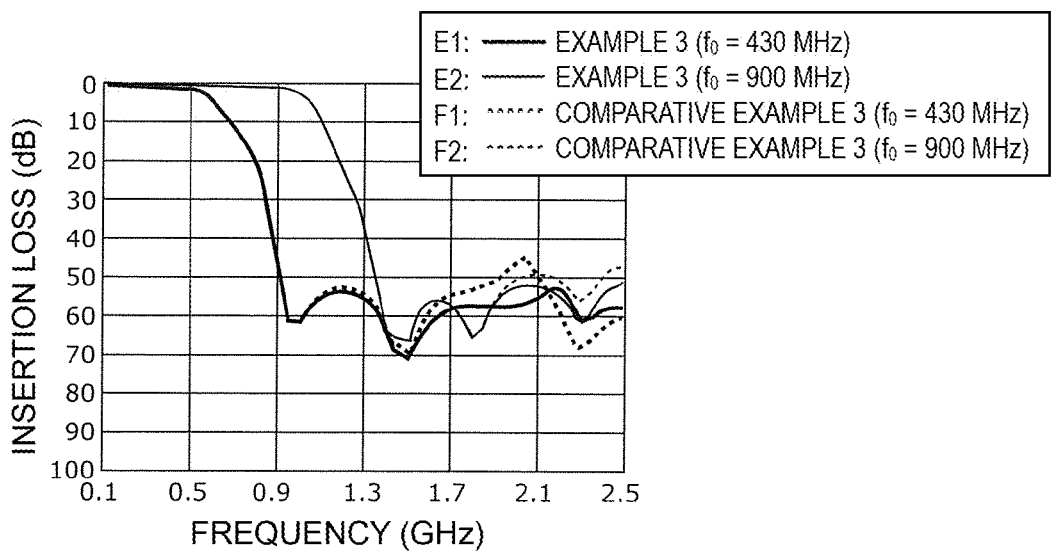
FIG. 4B is a comparison graph between the bandpass characteristics of the LC filter according to the alternative embodiment to the second embodiment and the bandpass characteristics of an LC filter according to Comparative Example 3.

FIG. 4B is a comparison graph between the bandpass characteristics of the LC filter according to the alternative embodiment (Example 3) to the second embodiment and the bandpass characteristics of an LC filter according to Comparative Example 3.

In the graph, two filter characteristics E1, E2 of the variable-frequency LC filter 1C according to the alternative embodiment (Example 3) to the second embodiment are shown. The filter characteristics E1 have a center frequency f0 of 430 MHz in a pass band (wide solid line). The filter characteristics E2 have a center frequency f0 of 900 MHz in a pass band (narrow solid line).

In addition, in the graph, two filter characteristics F1, F2 of the variable-frequency LC filter according to Comparative Example 3 are shown. The filter characteristics F1 have a center frequency f0 of 430 MHz in a pass band (wide dashed line). The filter characteristics F2 have a center frequency f0 of 900 MHz in a pass band (narrow dashed line).

The filter characteristics E1 and filter characteristics E2 of the LC filter 1C according to Example 3 are switched by the variable control unit 90 and the control lines 80. The filter characteristics F1 and filter characteristics F2 of the LC filter according to Comparative Example 3 are also switched by the variable control unit 90 and the control lines 80.

The LC filter according to Comparative Example 3 differs from the LC filter 1C according to Example 3 in that, when the multilayer circuit board is viewed in plan, the series arm capacitors 15a, 15b, 15c overlap with the ground electrode.

According to the comparison between the bandpass characteristics in FIG. 4B, each of the filter characteristics E1 and the filter characteristics E2 ensures desired insertion loss in the pass band and desired attenuation on the higher frequency side than the pass band. In contrast to this, the filter characteristics F1, F2 have deteriorated attenuation on the higher frequency side than the pass band as compared to the filter characteristics E1, E2.

The differences between the filter characteristics are due to whether the series arm capacitors 15a, 15b, 15c overlap with the ground electrode.

Third Embodiment

In the present embodiment, a variable-frequency LC filter that is applicable to a system for TV white space (TVWS) will be described.

[3.1 Circuit Configuration of LC Filter 1D]

Figure 5A:
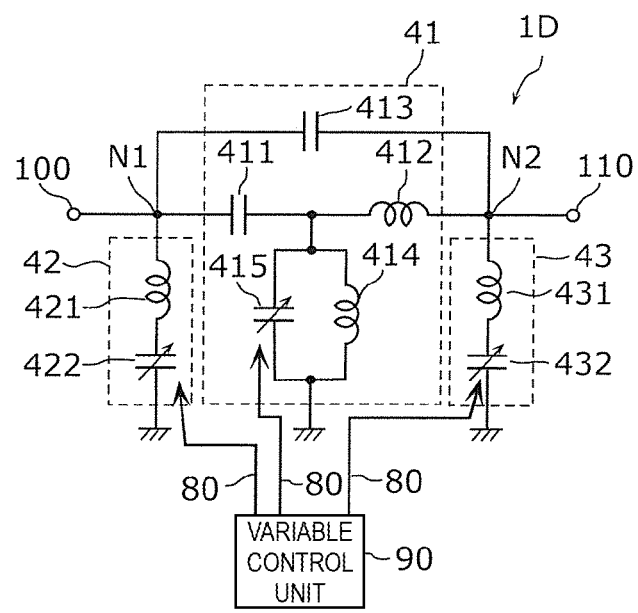
FIG. 5A is a circuit configuration diagram of an LC filter according to a third embodiment.

FIG. 5A is a circuit configuration diagram of the LC filter 1D according to the third embodiment. The LC filter 1D shown in the drawing includes the radio-frequency input terminal 100, the radio-frequency output terminal 110, a series arm LC filter circuit 41 (first series arm LC filter circuit), a parallel arm LC filter circuit 42 (first parallel arm LC filter circuit), and a parallel arm LC filter circuit 43 (second parallel arm LC filter circuit).

The series arm LC filter circuit 41 is connected between the radio-frequency input terminal 100 and the radio-frequency output terminal 110.

The parallel arm LC filter circuit 42 is connected between the node N1 and the ground electrode. The node N1 is one end of the series arm LC filter circuit 41. The parallel arm LC filter circuit 43 is connected between the node N2 and the ground electrode. The node N2 is the other end of the series arm LC filter circuit 41.

The parallel arm LC filter circuit 42 includes a parallel arm inductor 421 (first parallel arm inductor) and a variable capacitor 422 (first variable capacitor) connected in series with each other. The capacitance value of the variable capacitor 422 is adjustable.

The parallel arm LC filter circuit 43 is made up of a parallel arm inductor 431 (second parallel arm inductor) and a variable capacitor 432 (second variable capacitor) connected in series with each other. The capacitance value of the variable capacitor 432 is adjustable.

The series arm LC filter circuit 41 is made up of a series arm capacitor 413 (first series arm capacitor), an LC series circuit, and an LC parallel circuit.

The LC series circuit includes a series arm capacitor 411 (second series arm capacitor) and a series arm inductor 412 (first series arm inductor) connected in series with each other between the node N1 and the node N2.

The LC parallel circuit includes a parallel arm inductor 414 (third parallel arm inductor) and a variable capacitor 415 (third variable capacitor) connected in parallel with each other between the ground electrode and a connection node between the series arm capacitor 411 and the series arm inductor 412. The capacitance value of the variable capacitor 415 is adjustable.

A resonant frequency f41 of the series arm LC filter circuit 41 having the above-described circuit configuration mainly contributes to frequencies in a pass band of the LC filter 1D and a frequency at an attenuation pole on the higher frequency side than the pass band. Where the center frequency of the pass band is f0, a resonant frequency f412 of a parallel circuit made up of the parallel arm inductor 414 and the variable capacitor 415 is set so as to be lower than the center frequency f0 (f412<f0). In addition, a resonant frequency f411 of a parallel circuit made up of the series arm inductor 412 and the series arm capacitor 413 is set so as to be higher than the center frequency f0 (f411>f0). In addition, a resonant frequency f413 of a series circuit made up of the series arm capacitor 411 and the series arm inductor 412 is set so as to be higher than the center frequency f0 (f413>f0).

In addition, a resonant frequency f42 of the parallel arm LC filter circuit 42 mainly contributes to a frequency at an attenuation pole on the lower frequency side than the pass band of the LC filter 1D. At this time, the resonant frequency f42 is set so as to be lower than the center frequency f0 (f42<f0). More specifically, the resonant frequency f42 is set so as to be lower than the resonant frequency f412 (f42<f412).

In addition, a resonant frequency f43 of the parallel arm LC filter circuit 43 mainly contributes to a frequency at the attenuation pole on the higher frequency side than the pass band of the LC filter 1D. At this time, the resonant frequency f43 is set so as to be higher than the center frequency f0 (f43>f0). More specifically, the resonant frequency f43 is set so as to be higher than both the resonant frequencies f411, f413 (f42>f411, and f42>f413).

The radio-frequency input terminal 100, the radio-frequency output terminal 110, the series arm capacitor 411, the series arm inductor 412, the series arm capacitor 413, the parallel arm inductor 414, the parallel arm inductor 421, the parallel arm inductor 431, and the control lines 80 are formed in the multilayer circuit board. The multilayer circuit board is a resin multilayer circuit board, or the like, formed by laminating, for example, low-temperature cofire ceramic substrates (LTCC substrates) or glass epoxy substrates. In addition, the variable capacitors 415, 422, 432 and the other circuit elements may be coated with epoxy resin or another material on the multilayer circuit board.

Figure 5B:
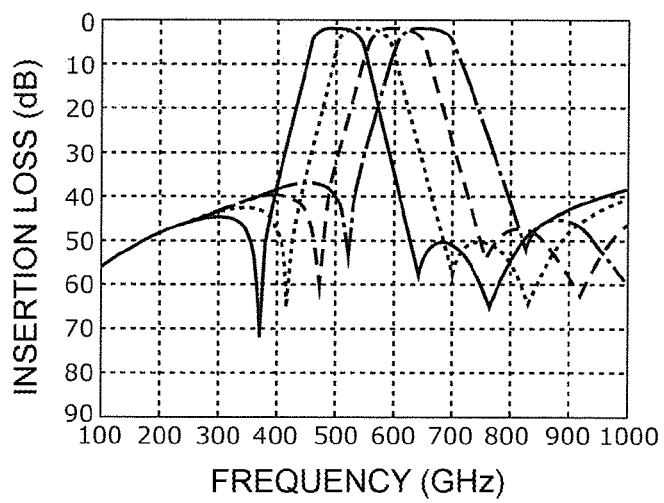
FIG. 5B is a graph showing the bandpass characteristics of the LC filter according to the third embodiment.

FIG. 5B is a graph that shows the bandpass characteristics of the LC filter 1D according to the third embodiment. As shown in the graph, with the LC filter 1D, the pass band width is approximately 100 MHz, and the attenuation poles are formed on both sides of the pass band. Furthermore, attenuation is hard to decrease in a frequency band on the side across each attenuation pole from the pass band, so desired attenuation is achieved in a wide frequency band. In addition, attenuation is increased on each of the higher frequency side and lower frequency side of the pass band, so a frequency band in which desired attenuation is obtained is widened. In addition, by changing the capacitance values of the variable capacitors 415, 422, 432, a band pass filter of which the frequencies of the pass band and attenuation poles are shifted is provided, as shown in FIG. 5B. Thus, in the system for TVWS of which the channel spacing is narrow, filter characteristics compatible with a plurality of channels are implemented with the single LC filter 1D.

When the multilayer circuit board is viewed in plan, among the series arm capacitor 411, the series arm inductor 412, the series arm capacitor 413, the parallel arm inductor 414, the parallel arm inductor 421, and the parallel arm inductor 431, only the parallel arm inductors 414, 421, 431 overlap with the ground electrode.

With the above-described configuration, when the multilayer circuit board is viewed in plan, the ground electrode is not formed at the locations that overlap with the series arm capacitors 411, 413 formed in the series arms, and the ground electrode is formed at the locations that overlap with the parallel arm inductors 414, 421, 431 formed in the parallel arms. Therefore, stray capacitances that are generated as a result of facing of the circuit elements formed in the multilayer circuit board to the ground electrode are reduced. Thus, no unnecessary coupling occurs in the series arm, so the deterioration of the frequency characteristics, such as the insertion loss and attenuation characteristics, of the LC filter 1D is reduced.

In the LC filter 1D according to the present embodiment, at least two of the parallel arm inductors 414, 421, 431 may be coupled by a magnetic field. Thus, the steepness of the pass band characteristics is improved, so the number of channels usable in the system for TVWS is increased.

Fourth Embodiment

In the present embodiment, a radio-frequency front-end circuit 10 and a communication device 9, including the LC filter according to any one of the first to third embodiments, will be described. The radio-frequency front-end circuit 10 and the communication device 9 according to the present embodiment are applied to, for example, a system for TVWS.

[4.1 Configurations of Radio-Frequency Front-End Circuit and Communication Device]

Figure 6:
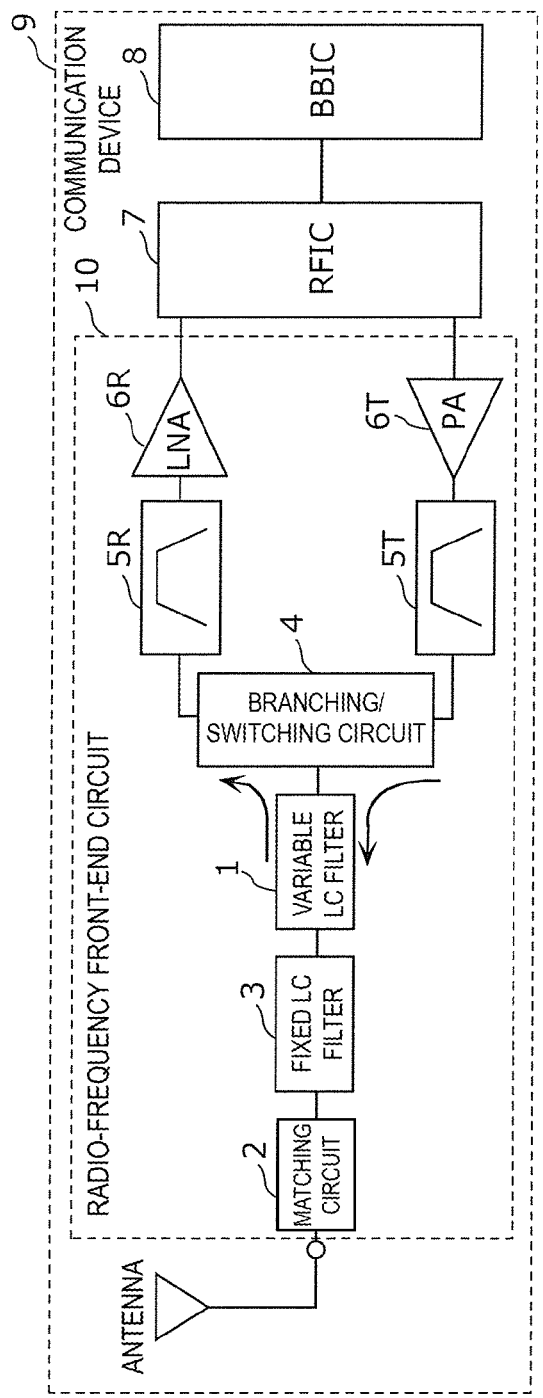
FIG. 6 is a circuit configuration diagram of a communication device according to a fourth embodiment.
Figure 7A:
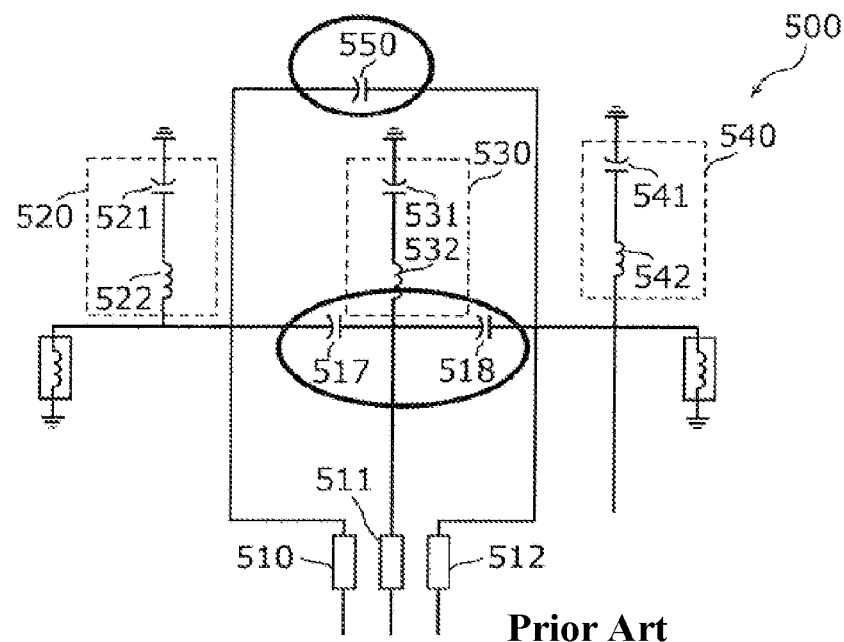
FIG. 7A is a circuit configuration diagram of the band pass filter described in Patent Document 1.
Figure 7B:
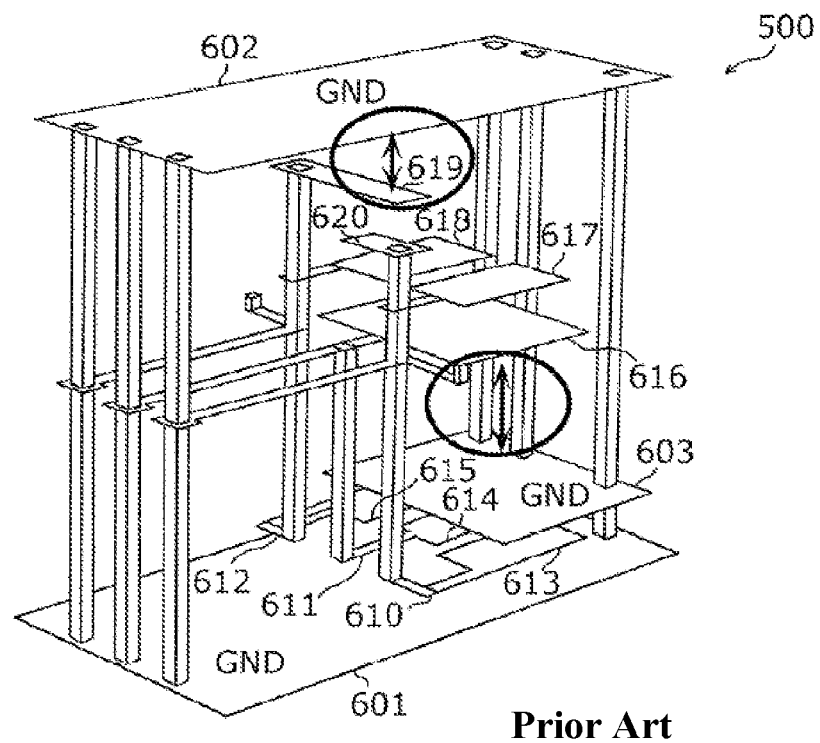
FIG. 7B is a packaging diagram of the band pass filter described in Patent Document 1.

FIG. 6 is a circuit configuration diagram of the communication device 9 according to the fourth embodiment. In the drawing, the radio-frequency front-end circuit 10, an antenna, an RF signal processing circuit 7, and a baseband signal processing circuit 8 are shown. The communication device 9 is made up of the antenna, the radio-frequency front-end circuit 10, the RF signal processing circuit 7, and the baseband signal processing circuit 8.

The radio-frequency front-end circuit 10 includes a variable LC filter 1, a matching circuit 2, a fixed LC filter 3, a branching/switching circuit 4, a receiving filter 5R, a transmitting filter 5T, a low-noise amplifier 6R, and a power amplifier 6T.

The power amplifier 6T is a transmission amplifier circuit that amplifies a radio-frequency transmission signal output from the RF signal processing circuit 7 and that outputs the radio-frequency transmission signal to the antenna via the transmitting filter 5T, the branching/switching circuit 4, the variable LC filter 1, the fixed LC filter 3, and the matching circuit 2.

The low-noise amplifier 6R is a receiving amplifier circuit that amplifies a radio-frequency signal passed through the antenna, the matching circuit 2, the fixed LC filter 3, the variable LC filter 1, the branching/switching circuit 4, and the receiving filter 5R and that outputs the radio-frequency signal to the RF signal processing circuit 7.

The fixed LC filter 3 is an antenna filter that is connected to the antenna via the matching circuit and that selectively passes, for example, radio-frequency signals in a transmission band and radio-frequency signals in a reception band.

The transmitting filter 5T is a filter that is disposed between the branching/switching circuit 4 and the power amplifier 6T and that selectively passes radio-frequency signals in the transmission band.

The receiving filter 5R is a filter that is disposed between the branching/switching circuit 4 and the low-noise amplifier 6R and that selectively passes radio-frequency signals in the reception band.

The branching/switching circuit 4 is a switch (branching filter) that switches between the connection of the antenna to a transmission signal path and the connection of the antenna to a reception signal path.

The RF signal processing circuit 7 processes a radio-frequency reception signal inputted from the antenna via the reception signal path by down-conversion, or the like, and outputs a reception signal generated through the signal processing to the baseband signal processing circuit 8. The RF signal processing circuit 7 is, for example, a radio frequency integrated circuit (RFIC). In addition, the RF signal processing circuit 7 processes a transmission signal inputted from the baseband signal processing circuit 8 by up-conversion, or the like, and outputs a radio-frequency transmission signal generated through the signal processing to the power amplifier 6T.

Signals processed by the baseband signal processing circuit 8 are, for example, used to display images as image signals.

The radio-frequency front-end circuit 10 may include another circuit element between the above-described circuit elements.

The radio-frequency front-end circuit 10 according to the present embodiment may employ any one of the LC filters 1A to 1D described in the first to third embodiments and the alternative embodiment as the variable LC filter 1. For example, when the radio-frequency front-end circuit 10 is applied to a system for TVWS, the variable LC filter 1 is disposed to reduce unnecessary spurious of TV waves, not sufficiently attenuated by the transmitting filter 5T, the receiving filter 5R, and the fixed LC filter 3. More specifically, the variable LC filter 1 is disposed to remove unnecessary spurious other than a channel to be used, from TV-band channels (for example, channel 13 to channel 65: 470 MHz to 788 MHz). In this case, the filter characteristics of the variable LC filter 1 desirably have comparable attenuation and steepness on each of the lower frequency side and the higher frequency side than the pass band; however, depending on the performance of the RF signal processing circuit 7, the filter may specialize in suppressing the spurious of harmonics.

With the variable LC filter 1 according to the present embodiment, no unnecessary coupling (stray capacitance) occurs in the series arm of the variable LC filter 1, so the deterioration of the insertion loss and attenuation characteristics is reduced. In addition, the radio-frequency front-end circuit 10 and the communication device 9, in which distortion in a high-gain range of a power amplifier is reduced, are provided. In addition, even when the radio-frequency front-end circuit 10 and the communication device 9 are miniaturized, unnecessary spurious is reduced.

OTHER EMBODIMENTS

The LC filter, radio-frequency front-end circuit, and communication device according to the embodiment of the present disclosure are described by way of the first to fourth embodiments. The LC filter, radio-frequency front-end circuit, and communication device of the disclosure are not limited to the above-described embodiments. The present disclosure also encompasses other embodiments implemented by combining selected elements of the above-described embodiments, alternative embodiments obtained by applying various modifications that are conceived of by persons skilled in the art to the above-described embodiments without departing from the purport of the present disclosure, and various devices that include the LC filter, the radio-frequency front-end circuit, or the communication device in this disclosure.

In addition, in the LC filter, radio-frequency front-end circuit, and communication device according to the above-described embodiments, another radio-frequency circuit element, wire, and the like, may be inserted in paths that connect the circuit elements and signal paths disclosed in the drawings.

The present disclosure is widely usable in communication equipment, such as cellular phones and systems for TVWS, as an LC filter disposed at a front end portion, a radio-frequency front-end circuit, and a communication device.

1 variable LC filter
1A, 1B, 1C, 1D LC filter
2 matching circuit
3 fixed LC filter
4 branching/switching circuit
5R receiving filter
5T transmitting filter
6R low-noise amplifier
6T power amplifier
7 RF signal processing circuit
8 baseband signal processing circuit
9 communication device
10 radio-frequency front-end circuit
11, 14, 15a, 15b, 15c, 411, 413 series arm capacitor
12, 13, 16a, 16b, 16c, 412 series arm inductor
21, 31, 414, 421, 431 parallel arm inductor
22, 32, 415, 422, 432 variable capacitor
41 series arm LC filter circuit
42, 43 parallel arm LC filter circuit
80 control line
90 variable control unit
100 radio-frequency input terminal
110 radio-frequency output terminal
500 band pass filter
510, 511, 512 resonator
517, 518 internal coupling capacitor
520, 530, 540 LC pair
521, 531, 541 load capacitor
522, 532, 542 load inductor
550 direct coupling capacitor
601, 602, 603 floating ground
610, 611, 612, 613, 614, 615, 616, 617, 618, 619, 620 metal region
N1, N2 node

The invention claimed is:

1. An inductive-capacitive (LC) filter comprising:
a multilayer circuit board;
an input electrode to which a radio-frequency signal is inputted;
an output electrode from which a radio-frequency signal is outputted;
a ground electrode constituted by one or more layers of the multilayer circuit board;
a first series arm capacitor provided in the multilayer circuit board and disposed in a series arm path connecting the input electrode to the output electrode; and
a first parallel arm inductor provided in the multilayer circuit board and disposed in a parallel arm path connecting the ground electrode to a first node on the series arm path, wherein
in a plan view of the multilayer circuit board, the first parallel arm inductor overlaps the ground electrode and the input electrode, the output electrode, and the first series arm capacitor do not overlap the ground electrode,
wherein:
the multilayer circuit board comprises a ground electrode layer,
the ground electrode layer comprises a ground electrode formation region and a ground electrode opening region,
the ground electrode is provided in the ground formation region and is not provided in the ground electrode opening region,
in a plan view of the ground electrode layer, the ground electrode opening region is surrounded by the ground electrode formation region in the plan view, and
in the plan view of the ground electrode layer, the first series arm capacitor is contained in the ground electrode opening region, and the first parallel arm inductor is contained in the ground electrode formation region.

2. An inductive-capacitive (LC) filter comprising,
a multilayer circuit board;
an input electrode to which a radio-frequency signal is inputted;
an output electrode from which a radio-frequency signal is outputted;
a ground electrode constituted by one or more layers of the multilayer circuit board;
a first series arm capacitor provided in the multilayer circuit board and disposed in a series arm path connecting the input electrode to the output electrode;
a first parallel arm inductor provided in the multilayer circuit board and disposed in a parallel arm path connecting the ground electrode to a first node on the series arm path, wherein
in a plan view of the multilayer circuit board, the first parallel arm inductor overlaps the ground electrode and the input electrode, the output electrode, and the first series arm capacitor do not overlap the ground electrode; and a first variable capacitor disposed in the parallel arm path that connects the first node to the ground electrode, a capacitance value of the first variable capacitor being adjustable,
wherein the first parallel arm inductor and the first variable capacitor are connected in series with each other.

3. The LC filter according to claim 2, further comprising:
a control line provided in the multilayer circuit board, the control line being configured to transmit a control signal that causes the capacitance value of the first variable capacitor to be adjusted, wherein:
in the plan view of the multilayer circuit board, the control line overlaps the ground electrode, and
in a cross section view of the multilayer circuit board, the ground electrode is interposed between the first parallel arm inductor and the control line.

4. The LC filter according to claim 2, wherein:
the first variable capacitor comprises:
 a plurality of fixed capacitors each having fixed capacitance values, and
 a switch configured to selectively switch combinations of electrical connections of the plurality of fixed capacitors, and
the plurality of fixed capacitors and the switch are mounted on a surface of the multilayer circuit board.

5. The LC filter according to claim 2, wherein
the first variable capacitor comprises:
 a plurality of fixed capacitors each having fixed capacitance values, and
 a switch configured to selectively switch combinations of electrical connections of the plurality of fixed capacitors, and
the plurality of fixed capacitors are provided in the multilayer circuit board.

6. The LC filter according to claim 2, further comprising:
a second parallel arm inductor provided in the multilayer circuit board and being disposed in a parallel arm path connecting a second node on the series arm path to the ground electrode, the second node being different from the first node; and
a second variable capacitor disposed in the parallel arm path connecting the second node to the ground electrode and having a capacitance value of the second variable capacitor that is adjustable, wherein
the second parallel arm inductor and the second variable capacitor are connected in series with each other.

7. The LC filter according to claim 6, further comprising:
a second series arm capacitor provided in the multilayer circuit board and being connected in series with the first series arm capacitor at the first node;
a third series arm capacitor provided in the multilayer circuit board and being connected in series with the first series arm capacitor at the second node;
a first series arm inductor connected in parallel with the first series arm capacitor;
a second series arm inductor connected in parallel with the second series arm capacitor; and
a third series arm inductor connected in parallel with the third series arm capacitor.

8. The LC filter according to claim 6, further comprising:
a first series arm LC filter circuit connected between the input electrode and the output electrode, a first end of the first series arm LC filter circuit being connected at the first node and a second end of the first series arm LC filter circuit being connected at the second node,
a first parallel arm LC filter circuit connected between the ground electrode and the first node, and
a second parallel arm LC filter circuit connected between the ground electrode and the second node, wherein:
the first parallel arm LC filter circuit is constituted by the first parallel arm inductor and the first variable capacitor,
the first parallel arm inductor and the first variable capacitor are connected in series with each other,
the second parallel arm LC filter circuit is constituted by the second parallel arm inductor and the second variable capacitor,
the second parallel arm inductor and the second variable capacitor are connected in series with each other,
the first series arm LC filter circuit is constituted by the first series arm capacitor, an LC series circuit, and an LC parallel circuit,
the LC series circuit comprises a second series arm capacitor and a first series arm inductor connected in series with each other between the first node and the second node, and
the LC parallel circuit comprises a third parallel arm inductor and a third variable capacitor connected in parallel with each other between the ground electrode and a node between the second series arm capacitor and the first series arm inductor, a capacitance value of the third variable capacitor being adjustable.

9. The LC filter according to claim 8, wherein at least two of the first parallel arm inductor, the second parallel arm inductor, and the third parallel arm inductor are coupled by a magnetic field.

10. An inductive-capacitive (LC) filter comprising:
a multilayer circuit board;
an input electrode to which a radio-frequency signal is inputted;
an output electrode from which a radio-frequency signal is outputted;
a ground electrode constituted by two or more layers of the multilayer circuit board;
a first series arm capacitor provided in the multilayer circuit board and disposed in a series arm path connecting the input electrode to the output electrode; and
a first parallel arm inductor provided in the multilayer circuit board and disposed in a parallel arm path connecting the ground electrode to a first node on the series arm path, wherein
in a plan view of the multilayer circuit board, the first parallel arm inductor overlaps the ground electrode and the input electrode, the output electrode, and the first series arm capacitor do not overlap any part of the ground electrode.

11. A radio-frequency front-end circuit comprising:
the LC filter according to claim 10;
a transmitting filter and a receiving filter; and
a branching filter configured to output a radio-frequency reception signal from an antenna to the receiving filter and to output a radio-frequency transmission signal, passed through the transmitting filter, to the antenna.

12. A communication device comprising:
the radio-frequency front-end circuit according to claim 11; and
an RF signal processing circuit configured to output the radio-frequency transmission signal to the radio-frequency front-end circuit and to receive the radio-frequency reception signal from the radio-frequency front-end circuit.

* * * * *